United States Patent [19]

Yatsuo et al.

[11] 4,240,091
[45] Dec. 16, 1980

[54] SEMICONDUCTOR CONTROLLED RECTIFIER DEVICE WITH SMALL AREA DV/DT SELF-PROTECTING MEANS

[75] Inventors: Tsutomu Yatsuo; Atsuo Watanabe; Yoshiteru Shimizu, all of Hitachi, Japan

[73] Assignee: Hitachi, Ltd., Japan

[21] Appl. No.: 68,571

[22] Filed: Aug. 22, 1979

[30] Foreign Application Priority Data

Aug. 23, 1978 [JP] Japan ................................. 53-101820

[51] Int. Cl.$^3$ ............................................ H01L 29/74
[52] U.S. Cl. .................................... 357/38; 357/13; 357/20; 357/86
[58] Field of Search ..................... 357/38, 20, 86, 13

[56] References Cited

U.S. PATENT DOCUMENTS

| 4,012,761 | 3/1977 | Ferro et al. | 357/38 |
|---|---|---|---|
| 4,060,825 | 11/1977 | Schlegel | 357/38 |
| 4,176,371 | 11/1979 | Schlegel | 357/38 |

*Primary Examiner*—Joseph E. Clawson, Jr.
*Attorney, Agent, or Firm*—Craig & Antonelli

[57] ABSTRACT

A main thyristor region is formed which comprises four continuous layers of alternately different conductivities consisting of first, second, third and fourth layers, PNPN for example. The main thyristor region constitutes a main thyristor section together with a couple of main electrodes in ohmic contact with the outside ones of the four layers. A pilot thyristor section and an auxiliary pilot thyristor section are constituted by employing the first, second and third layers of the main thyristor section and the main electrode in ohmic contact with the outside of the first layer and further by introducing fifth and sixth layers for forming PH junctions with the third layer. Further, there are provided a gate means for turning on the pilot thyristor section and an auxiliary gate means being in contact with the fifth or sixth layer. The auxiliary pilot thyristor section, main thyristor section and pilot thyristor section are formed in such a way that the respective triggering voltages satisfy the following relation:

$$|dV/dt|aux < |dV/dt|main, |dV/dt|pil$$

The whole peripheral area of the PN junction which is formed between the auxiliary pilot thyristor section and the third layer is short-circuited completely by the gate means for the auxiliary pilot thyristor section.

8 Claims, 11 Drawing Figures

SEMICONDUCTOR CONTROLLED RECTIFIER DEVICE WITH SMALL AREA DV/DT SELF-PROTECTING MEANS

BACKGROUND OF THE INVENTION

This invention relates in general to self-protected semiconductor controlled rectifier devices and more particularly to self-protected semiconductor controlled rectifier devices provided with means to prevent voltage breakdown thereto in excess of current leakage when in operation under high temperatures or in excess of withstand value of voltage increasing rate dV/dt.

As the technique to prevent voltage breakdown in semiconductor controlled rectifier devices thereto in excess of current leakage when operating the self-protected semiconductor controlled rectifier device under high temperatures or in excess of withstand value of voltage increasing rate dV/dt, the so called short emitter structure is witherto used.

The short emitter structure is understood to be a structure wherein an emitter junction at the cathode side is short-circuited at some places to the cathode so that when in off state a voltage having high withstand voltage increasing rate dV/dt is applied between the anode and cathode of the semiconductor controlled rectifier device the generated displacement current is by-passed through the above mentioned short-circuited places thus suppressing the injection of carriers from the emitter junction to the cathode and consequently the turning-on due to the withstand value of voltage increasing rate dV/dt is protected.

Further a method of increasing the short-circuit density in the short emitter has been employed to increase the withstand value of voltage increasing rate dV/dt, but in case when the short-circuit density is too large the semiconductor controlled rectifier device loses its conduction characteristics. Therefore, there is a limit imposed on the increase of the withstand value of voltage increasing rate dV/dt in semiconductor controlled rectifier devices. For example, for common power thyristors with specifications of 2500–4000 volts and 1000 ampere the maximum value of the above mentioned dV/dt is in the order of 1500–2000 V/μs.

There has been proposed a method for improving an above mentioned limit, which relates to incorporation in a semiconductor controlled rectifier device comprising a main thyristor section consisting of a main thyristor region having four continuous layers of alternate and different conductivities of PNPN with a couple of main electrodes connected in ohmic contact with the two outside layers of the main thyristor region, and a gate electrode connected to one of the layers. The incorporation is such that a pilot thyristor section and an auxiliary pilot thyristor section with higher gate sensitivity in comparison with that of the main thyristor section are incorporated in the semiconductor controlled rectifier device. Such a construction is disclosed U.S. Pat. No. 4,012,761 "SELF PROTECTED SEMICONDUCTOR DEVICE".

In general, however, the least gate current $I_{gt}$ necessary to turn on the semiconductor controlled rectifier device is defined as of hereunder. $I_{gt}$ should be selected in such way as to satisfy the relation $I_{gt1} < I_{gt} < I_{gt2}$, where $I_{gt1}$ is the value of the gate current which turns on by mistake the semiconductor controlled rectifier device when in operation under high temperatures, and $I_{gt2}$ is the value of the current imposed by the power restrictions on the gate circuit. As a result, the value of the resistance of the layer through which the gate current flows, should also be selected such as to satisfy the relation $I_{gt1} < I_{gt} < I_{gt2}$.

The structure presented in U.S. Pat. No. 4,012,761 is described hereinbelow. The pilot or auxiliary thyristors have a greater turn-on sensitivity than the main emitter region. This means that when main thyristor section, pilot thyristor section and auxiliary pilot thyristor section have withstand values of voltage increasing rate dV/dt respectively of $|dV/dt|$main, $|dV/dt|$pil and $|dV/dt|$aux, there is required that the condition of $|dV/dt|$main $>$ $|dV/dt|$pil, $|dV/dt|$aux should be satisfied. However, there is nothing said about the mutal relation between $|dV/dt|$pil and $|dV/dt|$aux. In order to fulfill the condition of $|dV/dt|$main $>$ $|dV/dt|$pil, the previously mentioned resistance of the layer wherein the gate current flows should be selected such as to satisfy this condition. In U.S. Pat. No. 4,012,761, as a result, the reistance of the layer wherein the gate current flows should satisfy both conditions of $I_{gt1} < I_{gt} < I_{gt2}$ and $|dV/dt|$max $>$ $|dV/dt|$pil at the same time. Consequently, the choice of the resistance of the layer wherein the gate current flows, is bound to a narrow range, which poses a disadvantage.

In case of both of the hereinabove mentioned conditions being fulfilled for the selected resistance of the layer through which the gate current flows, U.S. Pat. No. 4,012,761 still possesses the hereinbelow stated weak points. Namely, in the mentioned U.S. Pat. No. 4,012,716, in the edge between the second and third layer there is provided first negatively beveled region which reduces the electric field intensity thereat and increases the ultimate breakdown voltage of the semiconductor controlled rectifier device. The junction layer between the second and third layer of the above mentioned beveled region shows a trend to become inefficient. The leakage current in the surface layer of the junction increases therefore and the auxiliary pilot thyristor exhibits a weak point turning-on at a voltage lower than the operational one.

SUMMARY OF THE INVENTION

It is an object of this invention to provide a self-protected semiconductor controlled rectifier device with protection against malfunctioning.

It is further object of this invention to provide a self-protected semiconductor controlled rectifier device with protection against device breakdown or malfunctioning thereto in excess of leakage current or in excess of withstand value of voltage increasing rate dV/dt as well as against malfunctioning under high temperatures.

It is yet another object of this invention to provide a self-protected semiconductor controlled rectifier device with high switching power and high capacity.

In this invention special attention is payed to the relation in the above mentioned U.S. patent, namely $|dV/dt|$max $>$ $|dV/dt|$pil and $|dV/dt|$aux. In the present invention, firstly, by releasing the restriction of the relation $|dV/dt|$max $>$ $|dV/dt|$pil, the resistance of the layer in which the gate current flow is selected so that only the condition of $I_{gt1} < I_{gt} < I_{gt2}$ can be chosen freely. For that purpose in the present invention the resistance of the auxiliary pilot thyristor section is chosen such as to comply with the condition of $|dV/dt|$pil $>$ $|dV/dt|$aux.

Further, in order to resolve the weak point of the mentioned U.S. patent wherein the auxiliary pilot thyristor section is turned-on at a voltage lower than the operating one, in the present invention the auxiliary gate means of the auxiliary pilot thyristor section serves to short-circuit the whole periphery 30 of the PN junction formed between the third layer and the sixth layer (to be discussed hereinafter) provided in the auxiliary pilot thyristor section. Therefore, a voltage lower than the operating voltage is not conducted to the PN junction, but by-passed to the auxiliary gate means and the above mentioned disadvantage is overcome.

BRIEF DESCRIPTION OF THE DRAWINGS

FIGS. 1a and 1b depict a power thyristor in accordance with one embodiment of this invention, wherein FIG. 1a is a front view and FIG. 1b is a longitudinal sectional view taken on the line $I_b-I_b$ on FIG. 1a.

DESCRIPTION OF THE PREFERRED EMBODIMENTS

Figure 1A:
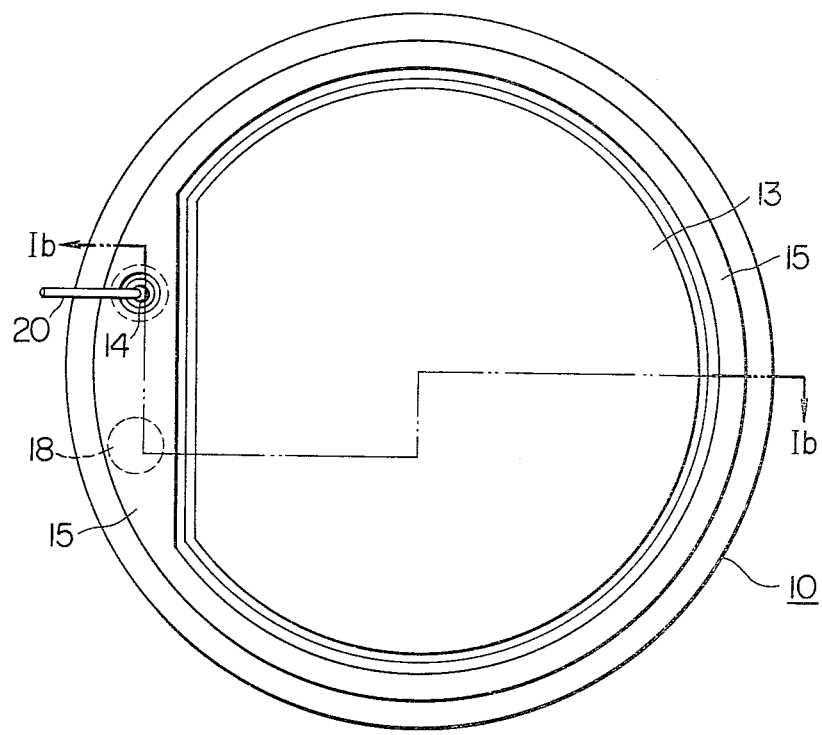
Figure 1B:
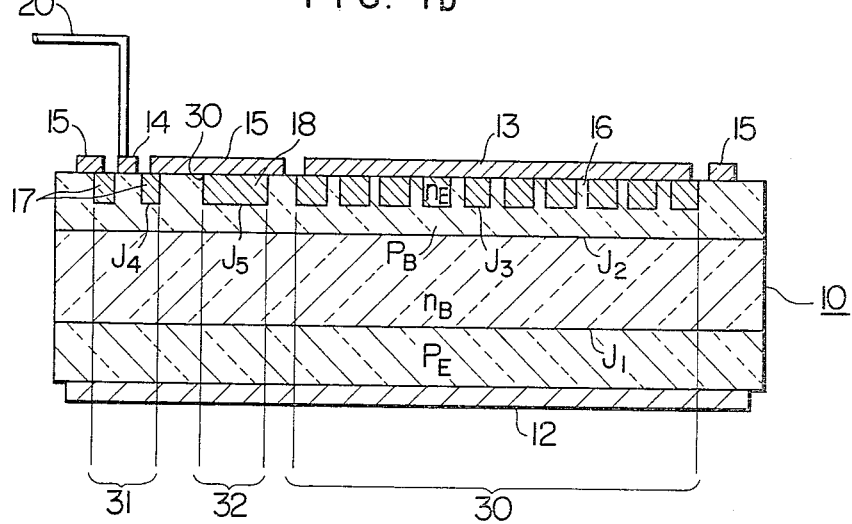

In FIGS. 1a and 1b the main thyristor section 30 consists of four continuous layers of alternate and different conductivities of PNPN. $P_E$ is first layer of a first conductivity type and is emitter layer, $N_B$ is second layer of second conductivity type and is base layer. $P_B$ is third layer having conductivity of first type and is base layer, and $N_E$ is fourth layer having conductivity of the second type and is emitter layer. This four continuous layers $P_E$, $N_B$, $P_B$, $N_E$ form three P-N junctions $J_1-J_3$, and there are two main electrodes, namely the anode 12 and cathode 13, in ohmic contact with the outside layers of the four layers. The $N_E$ is pierced in some places by the $P_B$ layer 16 and the PN junction $J_3$ is short-circuited by the cathode 13. Surrounding the main thyristor section 30 there is an annular shaped auxiliary gate electrode 15. This auxiliary gate electrode 15 is connected to a fifth N-type emitter layer 17 with comparative small surface, and N-type emitter layer 18, to be described later. The N-type emitter layer 17 is isolated by the third layer Pb from the fourth layer $N_E$ thereby forming with the third layer Pb the PN junction $J_4$. The n-type emitter layer 17 forms the pilot thyristor section 31 with the hereinabove mentioned $P_E$, $N_B$, $P_B$ layers and the anode 12. This pilot thyristor section in first place is turned on when there is a gate input signal from the gate electrode 14, which is in ohmic contact with the $P_B$ layer in the central part of the ringform N-type emitter layer 17. This load current flows in the annular auxiliary gate electrode 15 thereafter to become the gate current of the main thyristor section 30. As described above FIG. 1b shows the inner side of the auxiliary gate electrode 15 provided with the main thyristor section 30 therein.

The sixth layer 18 is of a disk form with a second type conductivity thus being an N-type emitter layer and with the layers $P_E$, $N_B$, $P_B$ and the anode 12 forms the auxiliary pilot thyristor section 32 which on its part is connected to the auxiliary gate electrode 15. This sixth layer 18 is not directly exposed to the surface of the auxiliary gate electrode 15.

For the present invention it is assumed that the second auxiliary emitter layer 18, namely the above described sixth layer, and the first auxiliary emitter layer 17, namely the above described fifth layer, are separated and found between the auxiliary gate electrode 15 and the anode 12. Further it is a feature of the present invention that as described hereinbefore, the withstand value of the voltage increasing rate $|dV/dt|$pil of the pilot thyristor section 31 and the withstand value of the voltage increasing rate $|dV/dt|$aux of the auxiliary pilot thyristor section 32, when compared and in order to fulfill the relation $|dV/dt|$pil$>|dV/dt|$aux therebetween, the first necessary condition is that the short circuit resistance between the N-type emitter layer 18 and the $P_B$ layer thereunder is to be chosen to a fixed value thereat by the resistance of the $P_B$ layer. As it is evident from FIG. 1b it is a characteristic feature of the structure of the fifth PN junction $J_5$ of the $N_E$ layer 18 that the auxiliary pilot thyristor section 32 is short-circuited by the auxiliary gate electrode 15.

Figure 2:
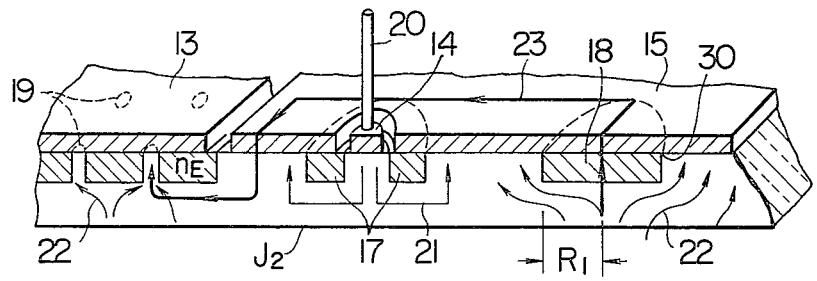
FIG. 2 illustrates the operation of a power thyristor shown in FIG. 1a and FIG. 1b.

Referring now to FIGS. 1a and 1b and to the expanded view of the main portions shown in FIG. 2, the operation of the self-protected semiconductor controlled rectifier device will be described hereinbelow. From FIG. 2 to FIG. 9 the first layer $P_E$, the second layer $N_B$ and the anode 12 are omitted.

The gate signal of the gate current passes through the gate lead 20 and flows in direction shown with the arrow 21 and in accordance with it the first auxiliary emitter layer 17 turns on. When a large withstand value of voltage increasing rate is applied to the device, the initial turn-on spreads over all thyristor sections and generates the lowest withstand value of voltage increasing rate $|dV/dt|$aux in the disk-form n-type emitter layer 18, which can be calculated consequently as described hereinbelow. The withstand maximum value of voltage increasing rate $(dV/dt)$max of the $N_E$ layer 18 can be expressed by the following approximate formula.

$$(dV/dt)\text{max} = 4V_D/C \cdot 1/(R_1 \cdot \rho_s) \tag{1}$$

Here C denotes the junction capacitance of the junction $J_2$ per unit junction area. $V_D$ is the built-in voltage of the junction $J_5$, $\rho_s$ is the sheet resistance of the $P_B$ layer and $R_1$ is the radius of the disk-form emitter layer 18.

When the voltage applied to the device has a voltage rise faster than the value $(dV/dt)$max given by the formula (1), there flows displacement current 22 and N-type emitter layer 18 turns-on first and the load current 23 passes through. The load current 23 flows in a direction indicated with an arrow in FIG. 2, and it is used as the gate current for the main thyristor section 30 and as a consequence thereto the main thyristor section is activated to turning-on.

In the present invention, as it is stated hereinbefore, the withstand value of voltage increasing rate $|dV/dt|aux$ of the auxiliary pilot thyristor is chosen such as to fulfill the relation $|dV/dt|pil > |dV/dt|aux$ and in this way the relation $|dV/dt|min > |dV/dt|pil$ poses no restrictions, which on its part means that even in case when $|dV/dt|main < |dV/dt|pil$ is in effect, the resistance of the third layer $P_B$ can readily be chosen to satisfy the previously stated relation of $I_{gt1} < I_{gt} < I_{gt2}$. The withstand value of voltage increasing rate $|dV/dt|aux$ of the auxiliary pilot thyristor section 32 can be adjusted freely in accordance with the radius $R_1$ of the disk-form auxiliary emitter layer 18, thus compared with the other sections of the device as the pilot thyristor section 31 or the main thyristor section 30, this withstand value of voltage increasing rate $dV/dt$ can be set up low. In this case the geometrical form of the n-type emitter layer has effect only on the turn-on characteristics of the gate current therefore the relation of $|dV/dt|pil > |dV/dt|aux$ is readily fullfilled thereby resolving hereinbefore the stated problems completely.

Furthermore in the present invention the whole surrounding 30 of the PN junction $J_5$ of the N-type emitter layer 18 is short-circuited by auxiliary gate electrode 15 and in case when, for example, in the surface area between the second layer $N_B$ and the third layer $P_B$ the leakage current increases, the resistance of the PN junction $J_5$ is larger compared to the resistance of the auxiliary gate electrode 15, thereby the mentioned leakage current flows in the auxiliary gate electrode 15, as a result therefrom the auxiliary pilot thyristor is not turned on by voltage lower than the operating one.

Yet for the preferred embodiment of this invention the second auxiliary emitter layer is in a disk form therefore giving the maximum switching power in case of $dV/dt$ trigger. The reason for it lies in that the comparatively wide emitter junction is built-up above a value greater than $V_{D_i}$ in the central part of the disk plate 18 due to displacement current 22. The second auxiliary emitter layer 18 is not restricted only to the form of a disk, but can be made of the same rectangular form as the first auxiliary layer or in any other polyhedral form.

In accordance with the present invention and, as hereinabove stated, in case when electric voltage with a rapid rise of the withstand value of voltage increasing rate $dV/dt$ is applied to the auxiliary pilot thyristor section generates a $dV/dt$ trigger and turns on therefore without leading to a breakdown in the device.

Figure 3:
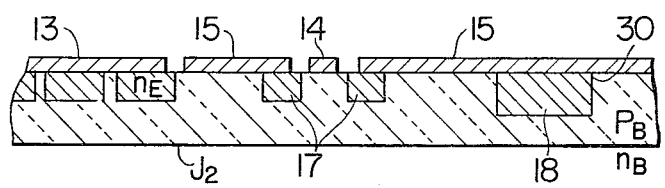
FIG. 3 and FIG. 4 illustrate one of the novel features of this invention in yet another embodiments, wherein the surface of the auxiliary pilot thyristor section is minimized to the utmost.
Figure 4:
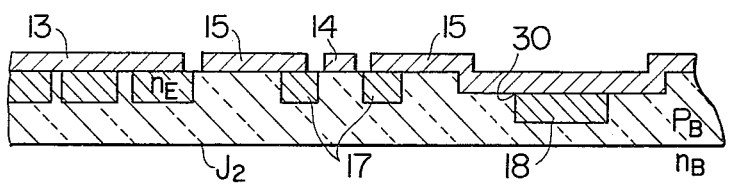

FIG. 3 and FIG. 4 refer to another embodiment of the present invention and illustrate a characteristic feature thereof wherein the surface area covered by the second auxiliary thyristor portion 18 is reduced to the utmost.

Referring to FIG. 3 the thickness of the second auxiliary thyristor layer 18 is fabricated thicker than the other portions of the n-type emitter layer 17. Also referring to FIG. 4 the part of the p-type base layer Pb of the second auxiliary emitter layer 18 is fabricated with reduced thickness. Further in both cases as illustrated in FIG. 3 and FIG. 4 the sheet resistance of the p-type base layer $P_B$ underlying the second auxiliary emitter layer 18 is made larger which leads to the advantage of decreasing the radius of the second auxiliary emitter layer 18 while retaining the same withstand value of voltage increasing rate $dV/dt$. Therefore the area covered by the main thyristor section can be relatively increased. As a result thereof the power-up of the self-protected semiconductor controlled rectifier device is further increased.

Figure 5:
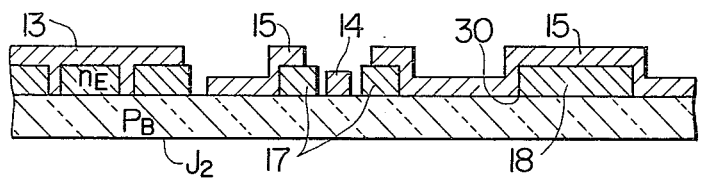
FIG. 5 illustrates an embodiment of this invention in case when upon the third layer there is deposited the emitter layer of each thyristor section.

FIG. 5 illustrates the case of the p-type base layer $P_B$ having the n-type emitter layer $N_E$ 17 and 18 layer built thereupon. By this fabrication method the device fabrication is readily simplified.

Figure 6:
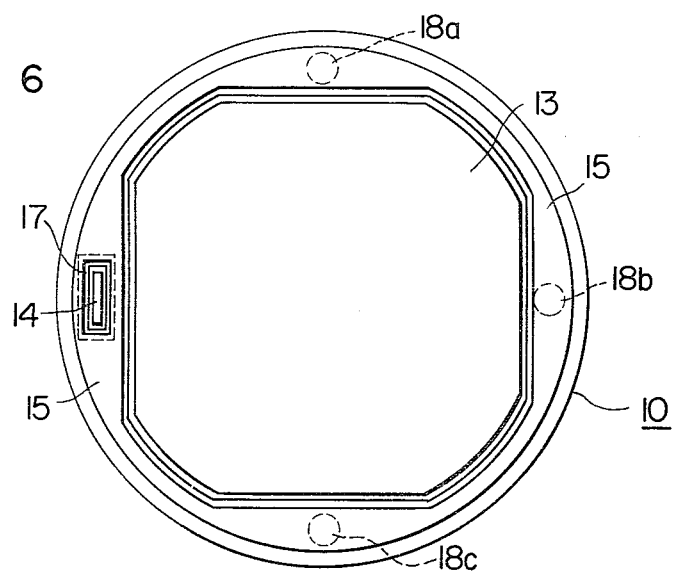
FIG. 6 illustrates an embodiment of this invention wherein the auxiliary pilot thyristor section is electrically connected to the auxiliary gate electrode directly and has a plurality of sixth layers separated by the third layer.

FIG. 6 illustrates yet another embodiment of the present invention wherein to the auxiliary gate electrode 15 in direct electrical contact, there are provided a plurality of second auxiliary emitter layers 18a–18c for $dV/dt$ trigger use. A device possessing this plurality of auxiliary pilot thyristor sections 18a–18c displays to a certain extent deviations in its bulk characteristics, but shows an advantage in the fact that at least one of the auxiliary pilot thyristor sections will produce $dV/dt$ trigger in advance of the main thyristor section.

Figure 7:
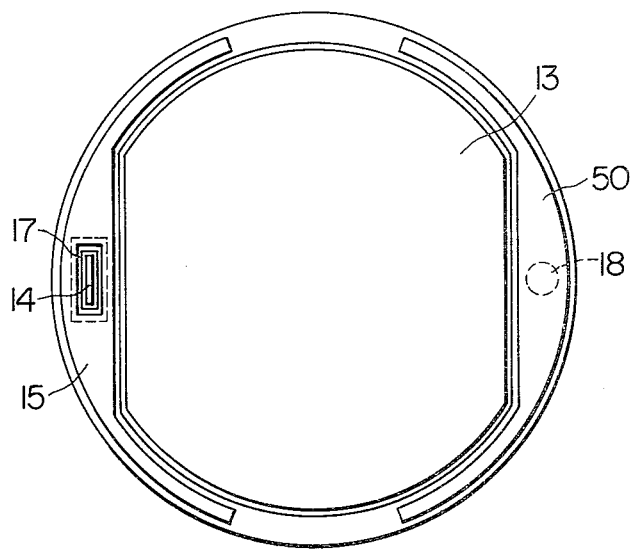
FIG. 7 illustrates an embodiment of this invention wherein to the gate trigger pilot thyristor section there is connected the first auxiliary gate electrode and a second auxiliary gate electrode is provided for the auxiliary pilot thyristor.

FIG. 7 illustrates yet another embodiment wherein for the first auxiliary gate electrode 15 of the pilot thyristor section 31 is provided the second auxiliary gate electrode 50 of the auxiliary pilot thyristor section 32. It is not necessary that the number of the gate electrode which is for the main thyristor section 30 and which is connected to the pilot thyristor section 31 and the auxiliary pilot thyristor section 32, is one, but as illustrated in FIG. 7, when a plurality of gate electrodes are provided, the degree of freedom of arranging the auxiliary pilot thyristor section increases.

Figure 8:
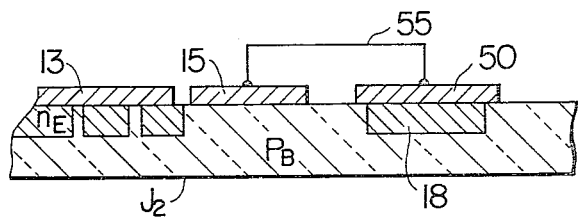
FIG. 8 and FIG. 9 illustrate the external connection between the first auxiliary gate electrode and the second auxiliary gate electrode in a different embodiment.
Figure 9:
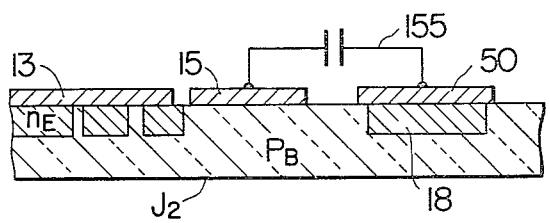

FIG. 8 and FIG. 9 illustrate the case when the auxiliary gate electrode 50 of the second auxiliary emitter layer 18 and the auxiliary gate electrode 15 to the main thyristor section 30, are connected by an external connection 55. With the above structure the auxiliary pilot thyristor section 32 can be fabricated in any place of the device thereupon. FIG. 9 illustrates the case when the two auxiliary gate electrodes 15 and 50 have a condensor 155 therebetween. With this structure the load current flowing in the auxiliary pilot thyristor section 32 is restricted only to charging up the condensor 155. Therefore, this structure has the merit to make the auxiliary pilot thyristor section 32 prone to breakdowns.

Figure 10:
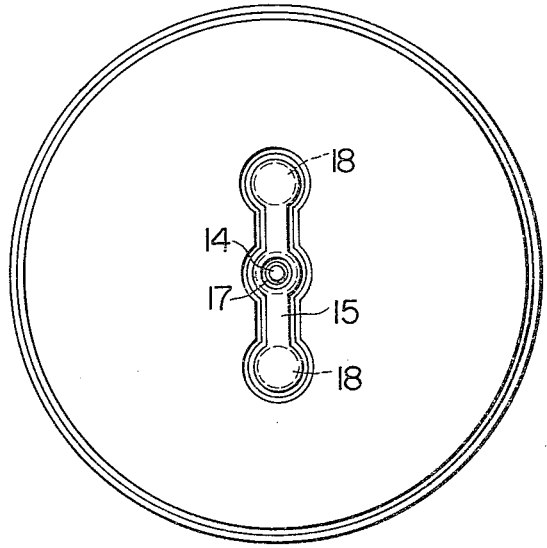
FIG. 10 illustrates an embodiment of this invention applied to a thyristor with a central gate structure.

FIG. 10 illustrates an embodiment of this invention utilizing a central gate structure. With the structure shown in FIG. 10 the cover area of the main thyristor section 30 is further enlarged which results in increasing the power-up of the device.

The embodiments of the present invention described hereinabove are for thyristor with a structure utilizing a gate electrode whereto electric signal is applied, but as it is well known to those skilled in the art, the present invention is suitable by applicable to a light triggered type thyristor in which light used for gate signal. Further, a semiconductor device with a conductivity of each layer inversed to those shown in FIG. 1, will function exactly in the same manner as the device described hereinabove.

What is claimed is:

1. A self-protected semiconductor controlled rectifier device comprising:
   (i) a main thyristor section including,
      a first layer of a first conductivity type,
      a second layer of a second conductivity type, being adjacent to said first layer for forming a first PN junction therewith,
      a third layer of said first conductivity type, being adjacent to said second layer for forming a second PN junction therewith, a fourth layer of said second conductivity type, being ajacent to said third layer for forming a third PN junction and having an exposed surface, a first main electrode in ohmic contact with at least the surface of said first layer, and a second main electrode in ohmic contact with at least the surface of said fourth layer;

(ii) a pilot thyristor section including said first, second, and third layers, said first electrode, and a fifth layer, said fifth layer being isolated from said fourth layer by said third layer, adjacent to said third layer for forming a fourth PN junction therewith, having an exposed surface, being smaller in area than said fourth layer, and being adapted to operate in association with said main thyristor thereby to turn on said main thyristor section when said pilot thyristor section is turned on;

(iii) an auxiliary pilot thyristor section including said first, second, and third layers, said first main electrode, and a sixth layer of said second conductivity type, said sixth layer being isolated from said fourth layer, having an exposed surface, forming a fifth PN junction with said third layer, and being smaller in area than said fourth area;

(iv) a gate means in contact with a part of the surface of said third layer for turning on said pilot thyristor section in response to a gate signal being applied to said gate means;

(v) first auxiliary gate means being in contact with said fifth layer; and (vi) second auxiliary gate means being in contact with said sixth layer;

the improvement wherein:

(vii) said auxiliary pilot thyristor section is triggered with a voltage increasing rate dV/dt lower than those of said pilot thyristor section and said main thyristor section, and (viii) the whole peripheral region of said fifth PN junction is short-circuited by said second auxiliary gate means.

2. A self-protected semiconductor controlled rectifier device comprising:

(i) a main thyristor section including, a first layer of a first conductivity type, a second layer of a second conductivity type, being adjacent to said first layer for forming a first PN junction therewith, a third layer of said first conductivity type, being adjacent to said second layer for forming a second PN junction therewith, a fourth layer of said second conductivity type, being adjacent to said third layer for forming a third PN junction and having an exposed surface, a first main electrode in ohmic contact with at least the surface of said first layer, and a second main electrode in ohmic contact with at least the surface of said fourth layer;

(ii) a pilot thyristor section including said first, second, and third layers, said first electrode, and a fifth layer, said fifth layer being isolated from said fourth layer by said third layer, adjacent to said third layer for forming a fourth PN junction therewith, having an exposed surface, being smaller in area than said fourth layer, and being adapted to operate in association with said main thyristor section thereby to turn on said main thyristor section when said pilot thyristor section is turned on;

(iii) an auxiliary pilot thyristor section including said first, second, and third layers, said first main electrode, and a sixth layer of said second conductivity type, said sixth layer being isolated from said fourth layer, having an exposed surface, forming a fifth PN junction with said third layer, and being smaller in area than said fourth area;

(iv) gate means in contact with a part of the surface of said third layer for turning on said pilot thyristor section in response to a gate signal being applied to said gate means;

(v) auxiliary gate means for electrically connecting said pilot thyristor section and said auxiliary pilot thyristor section;

the improvement wherein:

(vi) said auxiliary pilot thyristor section is lower in voltage increasing rate dV/dt than said pilot thyristor section and said main thyristor section, and (vii) the whole peripheral region of said fifth PN junction is short-circuited by said auxiliary gate means.

3. A self-protected semiconductor controlled rectifier device as defined in claim 1 or 2, wherein said sixth layer is formed in a disk-like shape.

4. A self-protected semiconductor controlled rectifier device as defined in claim 1 or 2, wherein said gate means comprises radiation sensitive gate means.

5. A self-protected semiconductor controlled rectifier device as defined in claim 1 or 2, wherein said third layer between said sixth and second layers is thinner in thickness than said third layer between said fourth and second layers and between said fifth and second layers.

6. A self-protected semiconductor controlled rectifier device as defined in claim 1 or 2, wherein there are provided a plurality of said sixth layers separated from each other by said third layer.

7. A self-protected semiconductor controlled rectifier device as defined in claim 1 or 2, wherein said pilot thyristor section and auxiliary pilot thyristor section, which comprise said gate means and auxiliary gate means, are formed to surround said main thyristor section.

8. A self-protected semiconductor controlled rectifier device as defined in claim 1 or 2, wherein said main thyristor section is formed to surround said pilot thyristor section and auxiliary pilot thyristor section which comprise said gate means and auxiliary gate means.

* * * * *